United States Patent
Kühn

(10) Patent No.: US 10,505,539 B2
(45) Date of Patent: Dec. 10, 2019

(54) OSCILLATOR AND INDUCTIVE PROXIMITY SWITCH

(71) Applicant: Pepperl + Fuchs GmbH, Mannheim (DE)

(72) Inventor: Thomas Kühn, Mannheim (DE)

(73) Assignee: Pepperl + Fuchs GmbH, Mannheim (DE)

( * ) Notice: Subject to any disclaimer, the term of this patent is extended or adjusted under 35 U.S.C. 154(b) by 187 days.

(21) Appl. No.: 15/556,678

(22) PCT Filed: Mar. 9, 2015

(86) PCT No.: PCT/EP2015/054839
§ 371 (c)(1),
(2) Date: Sep. 8, 2017

(87) PCT Pub. No.: WO2016/141965
PCT Pub. Date: Sep. 15, 2016

(65) Prior Publication Data
US 2018/0123587 A1    May 3, 2018

(51) Int. Cl.
*H03K 17/95* (2006.01)
*G01V 3/08* (2006.01)

(52) U.S. Cl.
CPC .......... *H03K 17/9545* (2013.01); *G01V 3/08* (2013.01); *H03K 17/9512* (2013.01)

(58) Field of Classification Search
CPC .......... H03K 17/9545; H03K 17/9512; H03K 17/9547; H03K 2217/94031; G01V 3/08
(Continued)

(56) References Cited

U.S. PATENT DOCUMENTS

2003/0080755 A1*  5/2003  Kobayashi ........... G01D 5/2405
324/658
2010/0225332 A1*  9/2010  Niwa ................. H03K 17/9502
324/652

FOREIGN PATENT DOCUMENTS

DE       102007014343 A1    10/2008
DE       102009028619 A1     3/2010
(Continued)

OTHER PUBLICATIONS

International Application No. PCT/EP2015/054839, International Preliminary Report on Patentability (English Translation), 12 pages.
(Continued)

*Primary Examiner* — Farhana A Hoque
(74) *Attorney, Agent, or Firm* — LaBatt, LLC

(57) ABSTRACT

The invention relates to an oscillator comprising a resonant circuit having at least one inductor and one capacitor and having a feedback amplifier, wherein there is at least one trimming resistor in a feedback circuit of the amplifier. The oscillator is characterized in that there is an electronic switching device for alternately connecting and disconnecting the trimming resistor, in that a trimming circuit is formed by the trimming resistor and the electronic switching device, in that there is a drive device for driving the electronic switching device, in that the electronic switching device, together with the drive device, is designed to alternately connect and disconnect the trimming resistor in a switching sequence, and in that an average time value of the electrical resistor of the trimming circuit, which is active in an oscillator mode, is defined by the switching sequence.

35 Claims, 6 Drawing Sheets

(58) Field of Classification Search
USPC .......................................... 324/652, 207.12
See application file for complete search history.

(56) References Cited

FOREIGN PATENT DOCUMENTS

| DE | 102010002201 A1 | 8/2011 |
|----|-----------------|--------|
| DE | 102010042512 A1 | 4/2012 |
| EP | 0461550 A2 | 12/1991 |

OTHER PUBLICATIONS

Jepsen, J., PCT/EP2015/054839, International Search Report (with English translation) and Written Opinion, dated Dec. 3, 2015, 15 pages.

* cited by examiner

Stand der Technik

OSCILLATOR AND INDUCTIVE PROXIMITY SWITCH

The present invention relates in a first aspect to an oscillator, in particular for an inductive proximity switch, according to the preamble of claim 1. Furthermore the invention relates to an inductive proximity switch having the oscillator according to the invention.

A generic oscillator has a resonant circuit, which has at least one inductor and one capacitor and a feedback amplifier, wherein there is at least one trimming resistor in a feedback circuit of the amplifier.

Oscillators of this type are used for inductive proximity switches and in particular for inductive proximity switches in which a detection signal for a target to be detected is generated by a damping of the oscillator through the, in particular metallic, target to be detected being evaluated.

In order to guarantee a defined functionality of such oscillators, the resonance impedance which is given by the quotient of the inductance and the product of the effective resistance and the resonant circuit capacitance, must be sufficiently well defined. For example, in the case of proximity switches, which evaluate a damping of the oscillator in order to generate therefrom a detection signal for the target to be detected, a switching distance can be set through targeted adjustment of the resonance impedance in defined boundaries. In this case, the switching distance is the distance in which the oscillator still oscillates. If the target to be detected moves even closer to the inductive proximity switch, the damping further increases due to the eddy currents generated in the target to be detected and the damping is so great that the oscillator is no longer capable of oscillating and, in other words, the loop gain can no longer reach the value 1.

This situation is explained in more detail by reference to FIG. 8. This shows an oscillator 100 for an inductive proximity switch, wherein, for example to generate a detection signal for a target to be detected, the damping of the oscillator caused by this target is evaluated. The oscillator has a resonant circuit having an inductor L and a capacitor C, which are connected in parallel in the example shown and are arranged in the positive feedback branch of an amplifier 10. The output of the amplifier 10 is connected via an adjustable resistor RT to the inductor L and the capacitor C. To adjust the amplification of the amplifier 10, the output of the amplifier 10 is additionally fed back via a resistor R4 to the inverting input. In addition the inverting input of the amplifier 10 is connected to earth via a resistor R3. The resonant circuit impedance can be adjusted with the aid of the adjustable resistor RT. In practice, for example, trimming resistors are used, which are initially brought to a defined resistance value through laser irradiation at the factory prior to delivery of an inductive proximity switch, the switching distance then being defined through the resistance value. This method does not allow any subsequent change of the trimming resistor RT and thus no subsequent changing of the switching distance.

Solutions are known in the prior art, for example DE 10 2007 014 343 B4, wherein a resistance is known through a transistor connected in parallel, which is only partially opened to adjust an effective resistance. In the case of such circuits there are additional requirements and boundary conditions due to the fact that the base voltage of the transistors must have a defined value in relation to the absolute values of the emitter and collector voltage.

It can be regarded as an object of the invention to provide an improved oscillator, wherein a resonance impedance can be particularly reliably defined, and wherein also a, in particular subsequent, change of the resonance impedance is possible in principle. In addition an improved proximity switch is to be created.

This object is achieved through the oscillator having the features of claim 1 and through a proximity switch having the features of claim 18.

The oscillator of the type indicated above is refined according to the invention in that there is an electronic switching device for alternately switching on and switching off the trimming resistor, a trimming circuit is formed via the trimming resistor and the electronic switching device, that there is a control device for controlling the electronic switching device, that the electronic switching device together with the control device is designed for alternately switching on and switching off the trimming resistor in a switching sequence, and that a temporal mean value of the electrical resistance of the trimming circuit effective in oscillator operation can be defined, or is defined, by the switching sequence.

It can be regarded as a fundamental idea of the invention not to permanently change a trimming resistor connected in a feedback circuit of the amplifier, whether this be through physical effects such as by laser irradiation or through simple adjustment as in the case of a potentiometer, but instead to quickly switch on and switch off this trimming resistor in a rapid time sequence, in order that a temporal mean value of the electrical resistance of the trimming circuit should be effective during oscillator operation.

Within the scope of this description "oscillator operation" is understood to be the situation in which a voltage supply of the oscillator is switched on. The oscillator can be capable of oscillating, thus oscillates. However, reference is also made to oscillator operation for a situation, in which the oscillator is not capable of oscillating, for example due to excessive damping, caused in particular by a trimming circuit according to the invention and/or a damping target.

A significant advantage of such an oscillator is that the oscillator characteristic, thus the amplification recorded against the oscillation amplitude, remains virtually unchanged. A further advantage is that temperature influences are clearly reduced, i.e. the temporal mean value of the resistance only depends to an extremely low extent on the temperature. Furthermore a strictly monotonic and at the same time constant trimming is facilitated by the trimming resistor that can be alternately switched on and switched off via an electronic switching device. This means that a temporal mean value of the electrical resistance of the trimming circuit and hence the resonance impedance of the oscillator can be changed strictly monotonically and constantly.

Within the scope of the present invention "switching on" the trimming resistor means that current flows through the trimming resistor in the electronic circuit, whereas in the switched off state of the trimming resistor the current flow through the trimming resistor is negligibly small.

The oscillator according to the invention can be used in practically any LC oscillator and can additionally be cost-effectively realised.

In comparison with solutions known in the prior art, wherein a trimming of an oscillator is carried out with a switchable resistor network, in the invention an electronic trimming of the oscillator is facilitated with significantly fewer components.

For the oscillator according to the invention, it comes down to the switching sequence specifically only insofar as a temporal mean value of the electrical resistance of the trimming circuit is defined by this switching sequence. This temporal mean value of the electrical resistance of the trimming circuit, in other words, is defined so that the resonance impedance does not vary in its entirety on a time basis during oscillator operation.

The switching sequence, thus the time-based sequence of switching on and switching off the trimming resistor through the electronic switching device can be defined in principle by analog circuits. However, digital electronic means, for example a microcontroller, are particularly preferably provided for adjusting the switching sequence.

In principle the switching sequence can be fixedly set by electronic means. In such variants, in comparison with laser-trimmable resistors, the advantage is achieved that the electronic sub-circuits that serve for adjusting the switching sequence are in principle exchangeable. The particular advantages of the invention are achieved, however, in exemplary embodiments, wherein the temporal mean value of the electrical resistance of the trimming circuit can be changed by adjusting, in other words by changing, the switching sequence, and that the temporal mean value of the electrical resistance, however, is otherwise, time-constant if the switching sequence is retained. In these variants, for example in the case of inductive proximity switches that have an oscillator according to the invention, the switching sequence and thus the temporal mean value of the electrical resistance of the trimming circuit and ultimately the resonance impedance of the oscillator can also be comfortably changed a long time after the initial setting.

In general, the temporal mean value of the electrical resistance of the trimming circuit is given by the value of the trimming resistance in itself and by a ratio of the periods in which the trimming resistor is switched on to a sum of the periods in which the trimming resistor is switched on, and of the periods in which the trimming resistor is switched off, in particular by the value of the trimming resistance and the duty cycle of a pulse width modulation.

The temporal mean value of the resistance of the trimming circuit is thereby to be taken over averaging durations that are large in comparison with the period duration of the oscillator, also large in comparison with typical time intervals between switching processes of the switching sequence, and particularly large in comparison with a period duration of a pulse width modulation.

Where reference is made within the scope of the present patent application to the temporal mean value of the resistance of the trimming circuit being defined or being time-constant, this means that the resistance only then still depends on possible fluctuations, drifts or imprecisions of the circuit components used, in particular therefore the resistors used, the switching device used and the control device used. Since, in the present invention, only comparatively few components are necessary, drifts and imprecisions resulting from a plurality of components being used can be reduced.

In principle the switching sequence comes down to this sequence being of such nature that a temporal mean value of the electrical resistance of the trimming circuit is definable or defined, thus well-defined. In a particularly preferred variant, the switching sequence is given through pulse width modulation with a pulse width modulation frequency. In particular, a pulse width modulation with precisely one frequency can be used. This is to be understood in that a switching sequence, wherein the switching device is actuated periodically, namely with a period associated with the pulse width modulation frequency, and indeed such that the switching device switches on the trimming resistor for respectively equal switch-on times and, also switches it off for respectively equal switch-off times. The switch-on and switch-off times can for example be of equal magnitude. The duty cycle is 0.5 in this case.

However, the duty cycle can in principle have any value between 0 and 1. All intermediate states between a situation in which the trimming resistor is always switched on until a situation in which the trimming resistor is always switched off can be adopted. The sum of the switch-on times within a period and the switch-off times within a period gives the period duration. In this respect also there is the significant factor for the invention that the trimming resistor is either switched on or switched off. Intermediate states as in the prior art, where for example a trimming resistor is approximately half switched on over a transistor section connected in parallel, are not possible with the oscillator according to the invention. The non-linearities and temperature drifts arising in such circuits of the prior art can be avoided in the invention.

Switching on and switching off the trimming resistor leads in the spectrum of the oscillator current to sidebands above and below the resonance frequency. These sidebands are moved upwards or downwards with respect to the resonance frequency in each case by the frequency of the pulse width modulation. In order to ensure that the current in the range of the resonance and thus the voltage drop at the resonant circuit is subjected to as little interference as possible with the resonance frequency, the frequency of the pulse width modulation or preferably all frequencies of the switching sequence are selected to be greater than half the bandwidth, preferably greater than the full bandwidth and particularly preferably greater than ten times the bandwidth. It is thereby ensured that the spectrum of the current in the range of the resonant circuit resonance is not notably distorted.

The bandwidth can be represented as the quotient of the resonance frequency and the quality of the resonant circuit.

In principle, for the switching sequence it only comes down to defining a temporal mean value of the electrical resistance of the trimming circuit, which is effective in oscillator operation. Defining a temporal mean value in this way can also be achieved in principle in variants of the oscillator according to the invention, wherein a frequency spectrum of the switching sequence, in comparison with a frequency spectrum of a pulse width modulation with a single pulse width modulation frequency, is expanded and/or contains additional frequencies. In principle it is also possible to operate with frequencies that are lower than a bandwidth of the resonant circuit resonance, provided that the frequency distribution of the switching sequence used is so broad that it only has a negligible effect on the resonant circuit resonance. For example this can be realised if the pulse width modulation frequency is swept within a variation interval, in particular continuously, wherein the temporal mean value of the electrical resistance of the trimming circuit remains constant during sweeping of the pulse width modulation frequency.

In principle, the switching sequence can also be an arbitrary sequence of switch-on times and switch-off times, wherein it must be guaranteed that the temporal mean value of the resistance of the trimming circuit is well-defined or, in other words, is time-constant.

With regard to the specific wiring of the trimming circuit in the oscillator according to the invention, there is in principle great freedom. The trimming circuit can be connected in a positive feedback circuit or in a negative feedback circuit of the amplifier. In principle, also both in the positive feedback circuit and also in the negative feedback circuit of the amplifier, a trimming circuit or a plurality of trimming circuits of the type described here may be present.

The electronic switching device can then be connected in parallel with the trimming resistor and the trimming resistor can be switched off by short circuit via the electronic switching device. In this embodiment the temporal mean value of the resistance of the trimming circuit can vary between an ultimate maximum value, which is given by the value of the trimming resistor, and practically zero in the event of short circuit.

In the same way the switching device can be connected in series with the trimming resistor, and the trimming resistor can be switched off by the electronic switching device. In this embodiment, the temporal mean value of the resistance of the trimming circuit can vary between an ultimate minimum value, which is given by the value of the trimming resistor, and practically infinitely when the switching device is open.

The trimming circuit can then be connected both in parallel and also in series with a resistor, in particular a feedback resistor. If the trimming circuit is connected in parallel with a feedback resistor, the resistance of this parallel circuit of resistors is lowered when the trimming resistor is switched on. In the case of the trimming resistor being connected in series with a feedback resistor, an adjustable additive component is added to the feedback resistance.

These switching variants can be varied and adapted according to expediency, in the same way as the specific dimensions of the trimming resistors and the feedback resistors.

In principle, any electronic switching device in which an essentially potential-free switching within an operating voltage range is possible (thus a switching that does not depend on the voltage specifically to be connected) can be used as an electronic switching device. Such components, in particular CMOS-based, are known and are described as analog switches.

In particularly advantageous variants the electronic switching device is digitally controlled. This is possible because, for adjusting the resistance, only two states, namely the switched off and the switched on state, are required. To adjust the switching sequence individually, digital components can therefore be used. Particularly advantageously a microcontroller is used as a control device. Preferably and expediently, this microcontroller can also be used for data evaluation and for other measuring and control tasks.

The change of the switching sequence of the trimming circuit, in other words the change of the temporal mean value of the electrical resistance of the trimming circuit, can be used in principle for any purposes. This possibility of the electronic trimming is particularly preferably used in order to adjust the switching distance. In principle this electronic trimming can also be used, however, to compensate still existing temperature drifts. For this, a temperature measurement device can usefully be provided for measuring a temperature of at least the resonant circuit. Based on a temperature measured by the temperature measurement device, the switching sequence and thus the temporal mean value of the resistance of the trimming circuit can be changed to compensate for temperature drifts. This can be realised based on data stored in a table and/or based on calculation algorithms, for example stored in the program memory of a microcontroller.

The advantages of the oscillator according to the invention are particularly apparent in an inductive proximity switch, which has such an oscillator according to the invention.

In particular there can be inductive proximity switches, which, to generate a detection signal, which indicates a target approaching, evaluates a damping of the oscillator by the target to be detected, a change in the inductance of the resonant circuit by the target and/or a change of a coupling of the inductor of the resonant circuit to a further inductor, in particular a receiving coil.

The proximity switch according to the invention preferably has an evaluation means, for example a microcontroller, to evaluate an oscillating state, in particular an oscillating amplitude, of the oscillator. Depending on the ascertained oscillating state, in particular therefore an ascertained oscillating amplitude, the evaluation means generates an output signal, which the proximity switch outputs and which can be fed to further components, for example a superordinate controller. In principle, it can be a continuous output signal. Particularly preferably the output signal is, however, a binary or digital switching signal, which indicates whether a target to be detected is closer than a switching distance to the proximity switch or whether the target is further away from the proximity switch than the switching distance. The evaluation means can in particular be the same electronic device that is also used to control the at least one trimming circuit. Particularly preferably a microcontroller is used as evaluation means.

In proximity switches, which evaluate a damping of the oscillator by a target, the switching distance is given by the distance at which the oscillator begins to oscillate if the target moves away from the proximity switch, or the distance at which, if the target approaches the proximity switch, the damping becomes so great that the oscillator can no longer oscillate.

In particularly preferred variants of a proximity switch according to the invention the control device is designed to adjust the switching distance by changing the switching sequence. The invention thus allows adjusting of the switching distance in a particularly advantageous way. In the case of proximity switches that evaluate a damping of the oscillator through a target, the switching distance can be changed by changing the amplification of the oscillator and/or by changing the damping of the oscillator. As explained above, both are possible depending on the wiring of the trimming circuit in the oscillator according to the invention.

In further preferred variants of inductive proximity switches according to the invention, a switching hysteresis is provided with the aid of the trimming circuit of the oscillator. For example the control device, for providing a switching hysteresis, can be designed to increase, in particular slightly, the switching distance after switching of the proximity switch due to a target approaching the proximity switch, and to reduce, in particular slightly, the switching distance after switching of the proximity switch due to the target moving away from the proximity switch.

In concrete terms, this can be achieved if the control device for providing a switching hysteresis is designed, after switching of the proximity switch due to a target approaching the proximity switch, to increase the temporal mean value of the electrical resistance of the trimming circuit and, after switching of the proximity switch due to the target moving away from the proximity switch, to reduce the temporal mean value of the electrical resistance of the trimming circuit.

Alternatively, the control device for providing a switching hysteresis can also be designed, after switching of the proximity switch due to a target approaching the proximity switch, to reduce the temporal mean value of the electrical resistance of the trimming circuit and, after switching of the proximity switch due to the target moving away from the proximity switch, to increase the temporal mean value of the electrical resistance of the trimming circuit.

Further advantages and features of the invention are explained below by reference to the attached figures, in which.

The same or similar components are generally identified by the same reference symbols in all the drawings.

Figure 1:
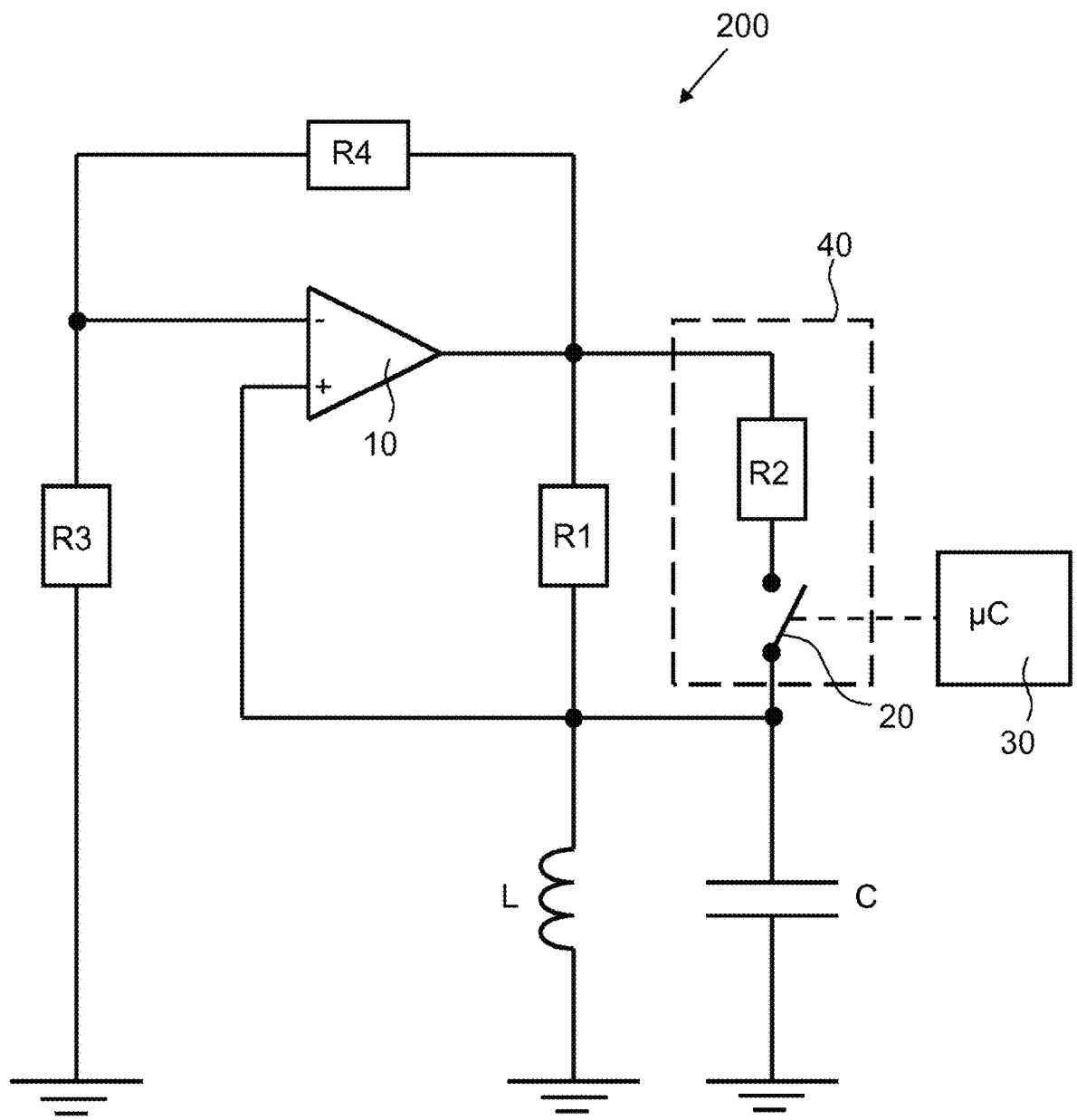
FIG. 1 shows a first exemplary embodiment of an oscillator according to the invention.
Figure 8:
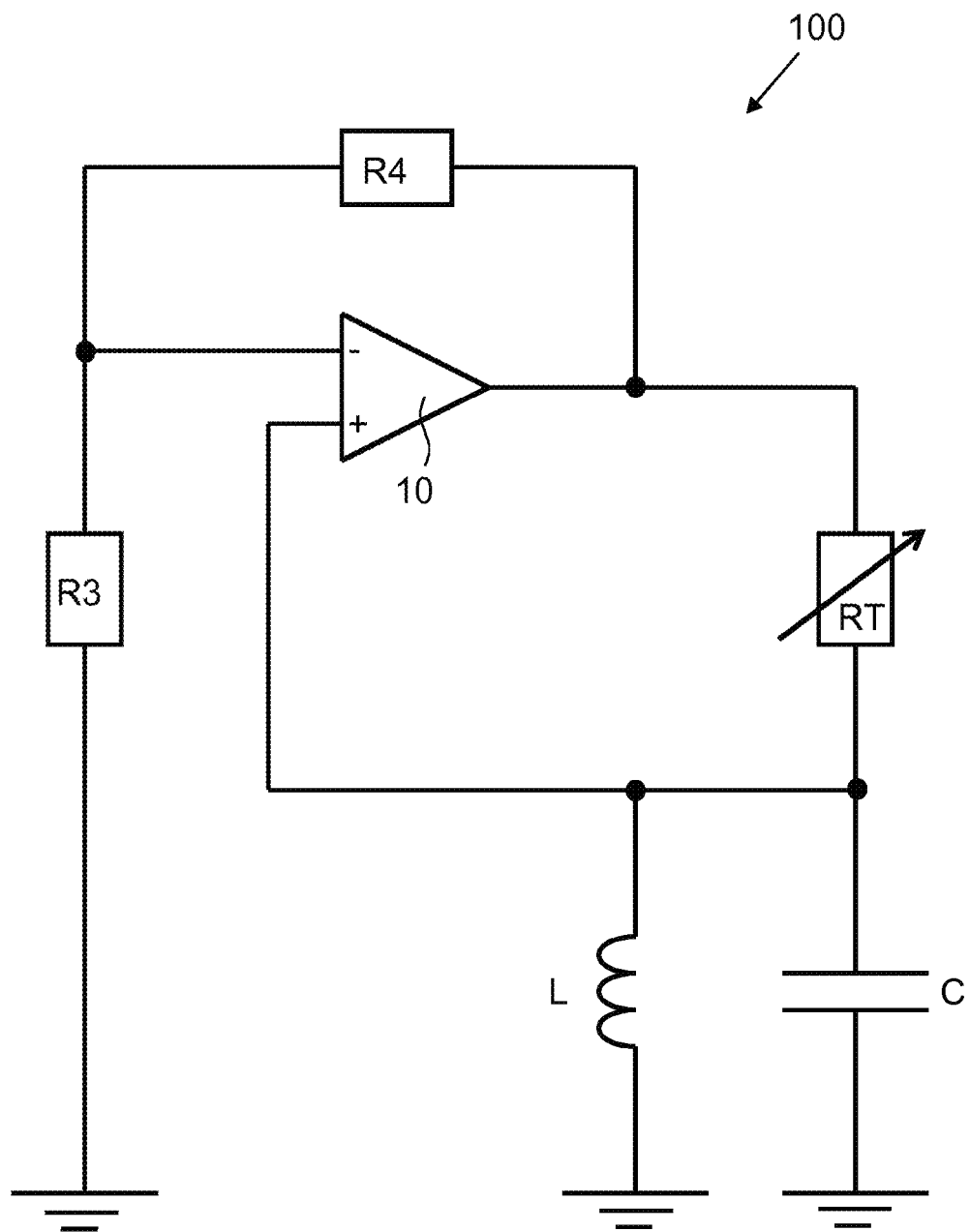
FIG. 8 shows an oscillator according to the prior art.

A first exemplary embodiment of an oscillator 200 according to the invention is shown in FIG. 1. In comparison with the oscillator, shown in FIG. 8, of the prior art, in the circuit in FIG. 1 a trimming circuit 40 with a trimming resistor R2 and an electronic switching device 20 is connected in parallel with the resistor R1 in the positive feedback branch of the amplifier 10. The electronic switching device is controlled with a control device 30, which can for example be a microcontroller. The control device 30 controls the electronic switching device such that the trimming resistor R2 is alternatingly switched on and switched off in an sequence. According to the invention, through the switching sequence, a temporal mean value of the electrical resistance is thereby defined which is effective during an operation of the oscillator 200.

Figure 2:
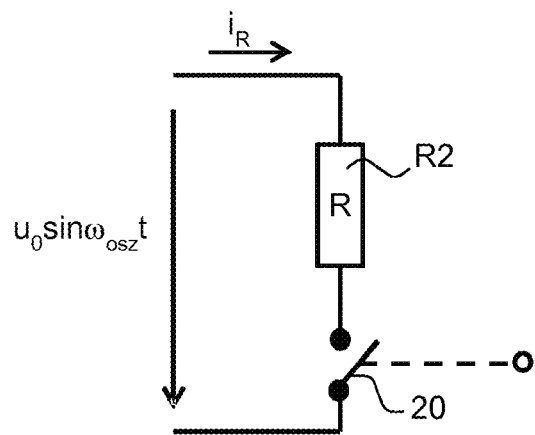
FIG. 2 shows a sub-circuit diagram to illustrate a current flowing in the trimming circuit.
Figure 3:
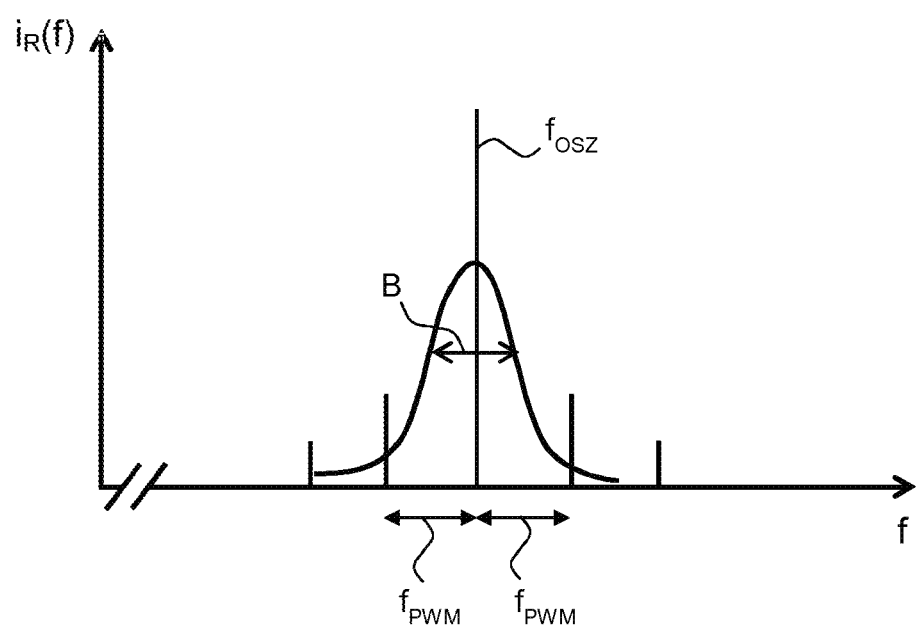
FIG. 3 shows a diagram in which the current in the trimming circuit is recorded against the frequency.

For example the switching sequence can be given by a pulse width modulation with a single pulse width modulation frequency $f_{PWM}$. With reference to FIGS. 2 and 3, this is explained in more detail. FIG. 2 illustrates the electrical variables current and voltage, at the trimming resistor R2. With Ohm's law and a Fourier analysis of the pulse width modulation, the current $i_R$ flowing through the trimming resistor R2 can be illustrated:

$$i_R = \left(\frac{U_O}{R}\right)\sin(\omega_{OSZ}t) \times \{a_o + a_1\cos(\omega_{PWM}t) + a_2\cos(2\omega_{PWM}t) + ...\}$$

Here, $U_0 \sin(\omega_{OSZ}t)$ is the voltage supplied to the trimming resistor R2, R is the nominal value of the trimming resistor R2, $\omega_{OSZ}$ is the circuit frequency of the resonance of the oscillator, $\omega_{PWM}=2\pi f_{PWM}$ is the circuit frequency of the pulse width modulation and $a_0$, $a_1$, $a_2$ are the Fourier coefficients of the pulse width modulation.

The ratio of the period $T_{on}$, during which the electronic switching device 20 is closed in a period duration $T_{PWM}$, the trimming resistor R2 is thus switched on, and the period duration $T_{PWM}=2\pi/\omega_{PWM}$ of the pulse width modulation is the duty cycle $p=a_0=T_{on}/T_{PWM}$ of the pulse width modulation.

The current component oscillating with the resonance frequency $f_{OSZ}$ of the oscillator is:

$$i(f_{OSZ})=u_0 a_0/R=u_0 p/R$$

This means that the temporal mean value of the electrical resistance of the trimming circuit 40, which can also be referred to as the effective resistance $R_{eff}$, is given by:

$$R_{eff}=u_0/i(f_{OSZ})=R/p$$

The situation in the frequency space is shown schematically in FIG. 3. Here, the current $i_R$ through the trimming resistor R2 is recorded against the frequency. The currency pattern corresponds to a typical resonance curve with a width B. At the resonance frequency $f_{OSZ}=\omega_{OSZ}/2\pi$, the current $i_R$ is maximal.

Through pulse width modulation with the pulse width modulation frequency $f_{PWM}=\omega_{PWM}/2\pi$, sidebands in the current spectrum arise, which are spaced apart from the resonance frequency $f_{OSZ}$ by the value of the pulse width modulation frequency $f_{PWM}$. In the illustration in FIG. 3, these sidebands are shown schematically by δ-type peaks with the frequencies $f=f_{OSZ}+/-f_{PWM}$. With the frequencies $f=f_{OSZ}+/-2f_{PWM}$, there are further, but weaker, sidebands, which belong to higher harmonics. The sidebands in the current spectrum generate a voltage drop at the resonant circuit, which can be seen as a slight modulation. These modulations can be extensively suppressed by a suitable choice of the pulse width modulation frequency $f_{PWM}$. The pulse width modulation frequency should be selected to be so great that the sidebands do not fall within the bandwidth of the resonance curve. This results in the design requirement that the pulse width modulation frequency should, where possible, be selected to be significantly greater than half the bandwidth B, which is given by the resonance frequency of the oscillator divided by the resonant circuit quality Q:

$$f_{PWM} \gg \frac{B}{2} = f_{OSZ}/Q$$

In the variant shown in FIG. 2, the electronic switching device 20 is connected in series with the trimming resistor R2. The trimming resistor R2 is accordingly switched on by closing the electronic switching device 20 and switched off by opening the switching device 20.

Figure 4:
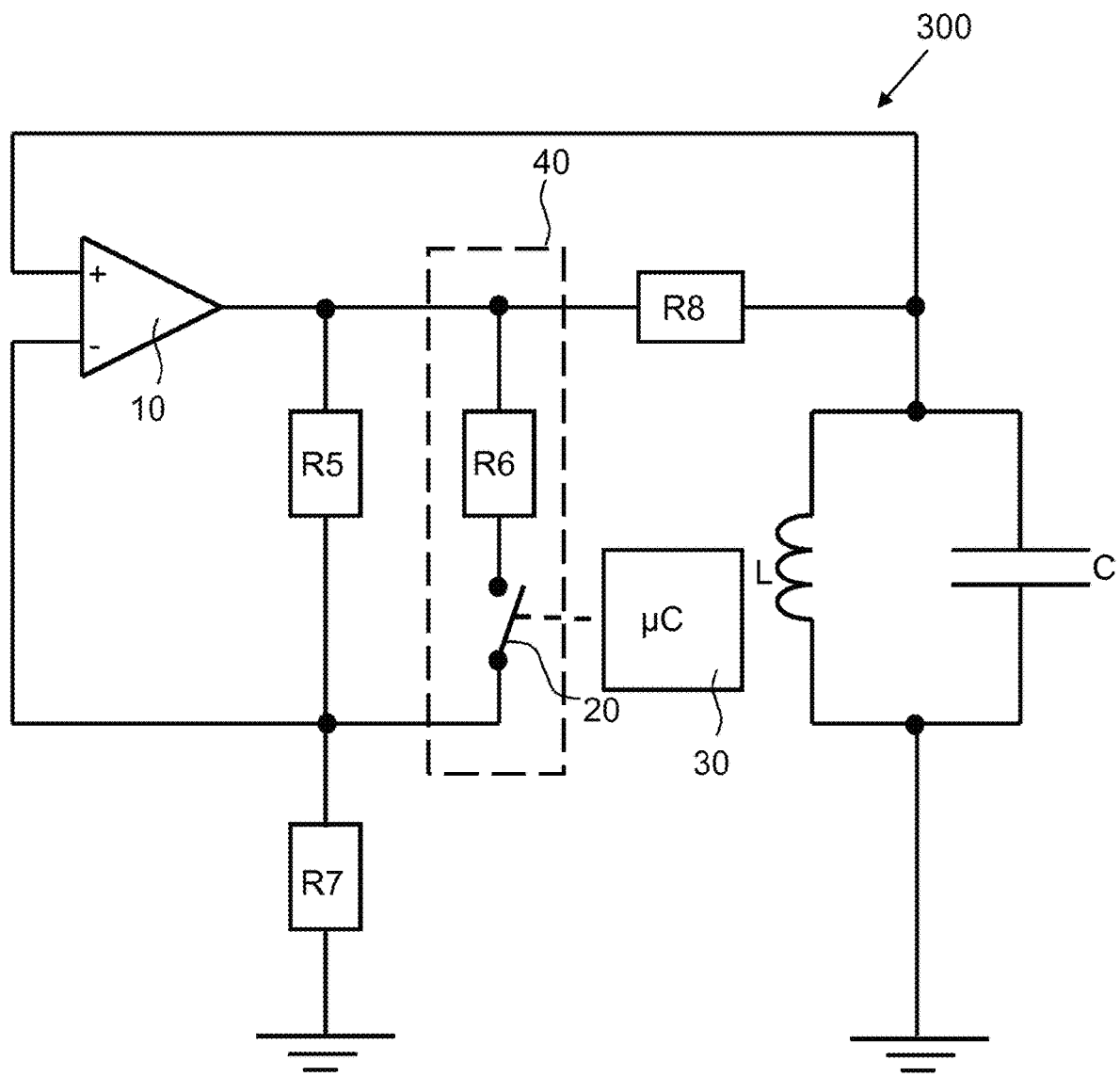
FIG. 4 shows a second exemplary embodiment of an oscillator according to the invention.

Furthermore a trimming circuit 40 can also, as in the case of the oscillator 300 shown in FIG. 4, be connected in the negative feedback circuit. Through the resistors R5, R7 and the trimming circuit 40 with the resistor R6, the amplification of the amplifier 10 is adjusted in the example of FIG. 4. A pre-damping of the resonant circuit L, C is provided through the resistor R8. This brings with it the same advantages, in particular that the oscillator characteristic is not influenced by the trimming circuit 40, there are only negligible temperature influences, and, through the trimming circuit provided according to the invention, a trimming that is in principle strictly monotonic and constant can be carried out.

Figure 5:
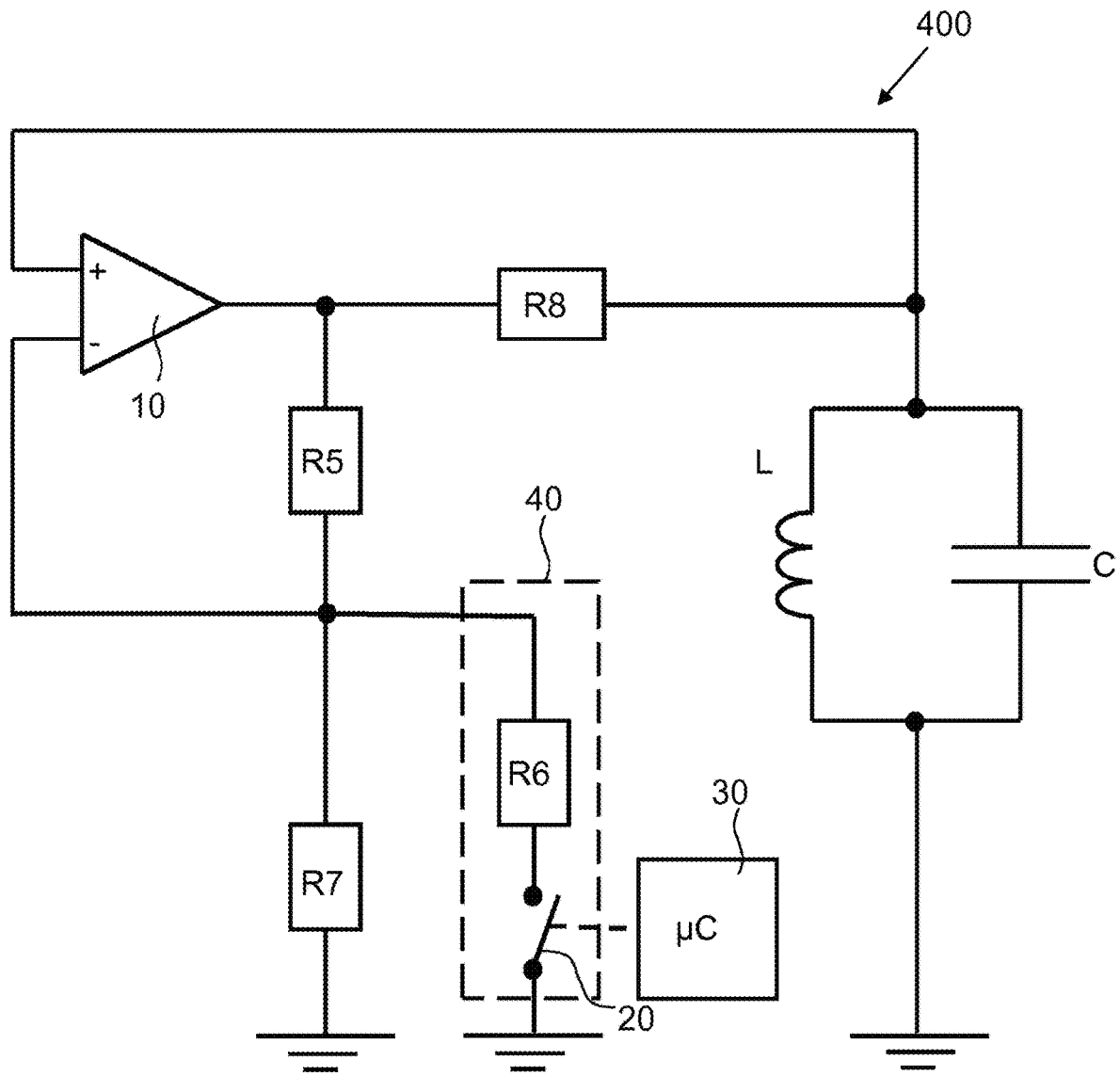
FIG. 5 shows a circuit variant, which can be used in the exemplary embodiment of FIG. 1 or the exemplary embodiment of FIG. 4.

FIG. 5 shows a third exemplary embodiment of an oscillator 400 according to the invention. This is a variant of circuit shown in FIG. 4. As can be seen from FIG. 5, the trimming circuit 40 with the trimming resistor R6 is connected in parallel with the resistor R7 to earth. These circuit alternatives can be selected depending on expediency, in particular depending on desired adjusting possibility. In principle, it is also possible to connect the trimming device 40 in parallel with the capacitor C and the inductor L.

Figure 6:
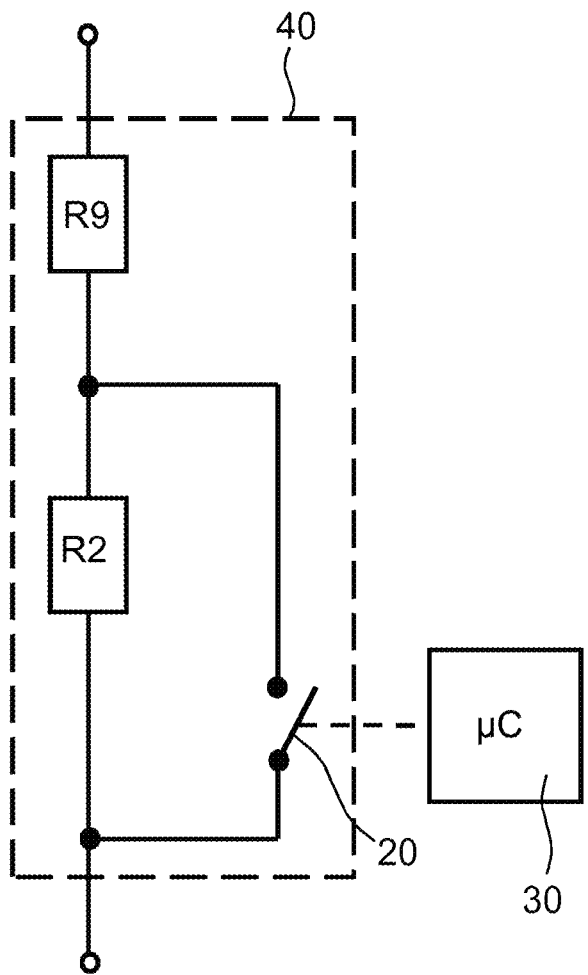
FIG. 6 shows a third exemplary embodiment of an oscillator according to the invention.

In principle, variants are also possible, as shown in FIG. 6, wherein the electronic switching device 20 is connected in parallel with the trimming resistor R2. The trimming resistor R2 is then switched off, namely short-circuited (the resistance of the trimming circuit 40 is then given by the resistor R9) by closing the electronic switching device 20 and switched on by opening the electronic switching device 20.

Figure 7:
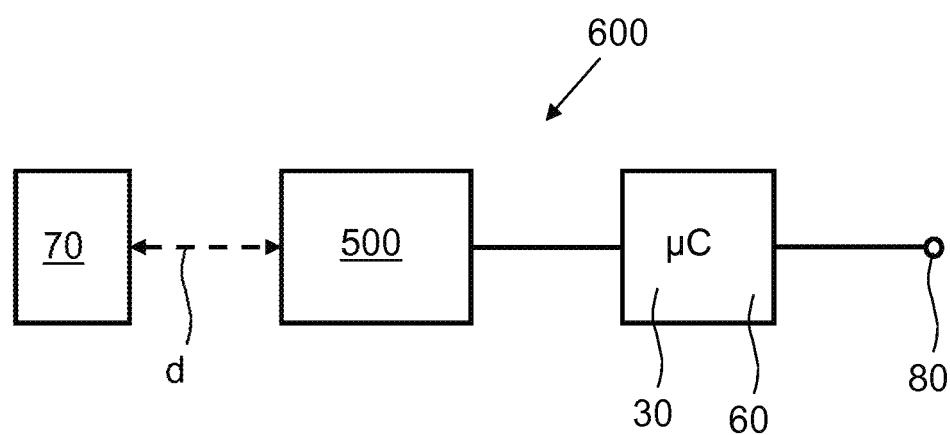
FIG. 7 shows a schematic illustration of an inductive proximity switch according to the invention.

FIG. 7 shows in a schematic illustration an inductive proximity switch 600 according to the invention. This has an oscillator 500 according to the invention and an evaluation means 60. In the example shown, the evaluation means 60 is the same microcontroller that also acts as a control device 30 in the trimming circuit (not shown here) of the oscillator 500. The evaluation means 60 evaluates in a manner that is known in principle an oscillating state, in particular an oscillation amplitude of the oscillator 500. Depending on this evaluation, the evaluation means 60 outputs, at an output 80, one, in particular binary, switching signal. In the situation shown in FIG. 7, a target 70 is precisely at a switching distance d from the oscillator 500 as part of the proximity switch 600.

A new type of oscillator is presented with the present invention, which is suited in particular for use in inductive proximity switches, and which is particularly easy to trim and wherein, above all, the trimming can be changed and newly adjusted at any time.

LIST OF REFERENCE NUMERALS

10 Amplifier
20 Electronic switching device
30 Control device, microcontroller
40 Trimming circuit
60 Evaluation means
70 Target
80 Switching output
100 Oscillator according to the prior art
200 Oscillator according to the invention
300 Oscillator according to the invention
400 Oscillator according to the invention
500 Oscillator according to the invention
600 Proximity switch
B Bandwidth of the resonant circuit resonance
d Switching distance
f Frequency
$f_{OSZ}$ Resonance frequency of the resonant circuit
$f_{PWM}$ Frequency of a pulse width modulation
$i_R$ Current through resistor R
$i_R(f)$ Current as a function of frequency
C Capacitor of the resonant circuit
L Inductor of the resonant circuit
R1 Resistor in the positive feedback circuit
R2 Trimming resistor
R3 Resistor in the negative feedback circuit, part of a voltage divider
R4 Resistor in the negative feedback circuit, part of a voltage divider
R5 Resistor in the negative feedback circuit, part of a voltage divider
R6 Resistor of a trimming circuit 40
R7 Resistor in the negative feedback circuit, part of a voltage divider
R8 Resistor in the positive feedback circuit
R9 Resistor in the trimming circuit
RT Adjustable resistor

The invention claimed is:

1. An oscillator, comprising:
   a resonant circuit having at least one inductor and at least one capacitor and a feedback amplifier,
   wherein in at least one feedback circuit of the amplifier there is at least one trimming resistor,
   wherein
   there is an electronic switching device for alternately switching on and switching off the trimming resistor,
   a trimming circuit is formed by the trimming resistor and the electronic switching device,
   there is a control device to control the electronic switching device,
   the electronic switching device, together with the control device, is designed to alternately switch on and switch off the trimming resistor in a switching sequence, and
   a temporal mean value of the electrical resistance of the trimming circuit is defined by the switching sequence, which is effective during oscillator operation, wherein
   the temporal mean value of the electrical resistance of the trimming circuit is given by the value of the trimming resistor and by a ratio of a sum of the periods in which the trimming resistor is switched on to a sum of the periods in which the trimming resistor is switched off.

2. The oscillator according to claim 1,
   wherein
   it is designed for use in an inductive proximity switch.

3. The oscillator according to claim 1,
   wherein
   there are digital-electronic means for adjusting the switching sequence.

4. The oscillator according to claim 3,
   wherein
   the digital-electronic means for adjusting the switching sequence is a microcontroller.

5. The oscillator according to claim 1,
   wherein
   the temporal mean value of the electrical resistance of the trimming circuit is time-constant when the switching sequence is maintained.

6. The oscillator according to claim 1,
   wherein
   the temporal mean value of the electrical resistance of the trimming circuit can be changed by adjusting the switching sequence.

7. The oscillator according to claim 1,
   wherein
   the switching sequence is given by a pulse width modulation with a pulse width modulation frequency.

8. The oscillator according to claim 7,
   wherein
   the switching sequence is given by a pulse width modulation with a single pulse width modulation frequency.

9. The oscillator according to claim 1,
   wherein
   a frequency spectrum of the switching sequence, in comparison with a frequency spectrum of a pulse width modulation, is expanded by a single pulse width modulation frequency.

10. The oscillator according to claim 9,
    wherein
    a pulse width modulation frequency is swept, in particular continuously, within a variation interval, wherein the temporal mean value of the electrical resistance of the trimming circuit remains constant during sweeping of the pulse width modulation frequency.

11. The oscillator according to claim 9, wherein said pulse width modulation frequency is continuously swept within a variation interval, wherein the temporal mean value of the electrical resistance of the trimming circuit remains constant during sweeping of the pulse width modulation frequency.

12. The oscillator according to claim 9, wherein the switching sequence is an arbitrary sequence of switching on and switching off times, wherein the temporal mean value of the resistance of the trimming circuit is time-constant.

13. The oscillator according to claim 1, wherein a frequency spectrum of the switching sequence, in comparison with a frequency spectrum of a pulse width modulation, contains additional frequencies.

14. The oscillator according to claim 13, wherein a pulse width modulation frequency is swept, in particular continuously, within a variation interval, wherein the temporal mean value of the electrical resistance of the trimming circuit remains constant during sweeping of the pulse width modulation frequency.

15. The oscillator according to 13, wherein said pulse width modulation frequency is continuously swept within a variation interval, wherein the temporal mean value of the electrical resistance of the trimming circuit remains constant during sweeping of the pulse width modulation frequency.

16. The oscillator according to 13, wherein the switching sequence is an arbitrary sequence of switching on and switching off times, wherein the temporal mean value of the resistance of the trimming circuit is time-constant.

17. The oscillator according to claim 1, wherein at least one frequency of the switching sequence is greater than half a bandwidth of the resonant circuit resonance.

18. The oscillator according to claim 1, wherein at least one frequency of the switching sequence is greater than a total bandwidth of the resonant circuit resonance.

19. The oscillator according to claim 1, wherein at least one frequency of the switching sequence is greater than ten times the bandwidth of the resonant circuit resonance.

20. The oscillator according to claim 1, wherein at least one trimming circuit is connected in at least one of a positive feedback circuit and a negative feedback circuit of the amplifier.

21. The oscillator according to claim 1, wherein the trimming circuit is connected in one of parallel or series with a feedback resistor.

22. The oscillator according to claim 1, wherein the electronic switching device is connected in parallel with the trimming resistor and the trimming resistor can be switched off by short-circuit via the electronic switching device.

23. The oscillator according to claim 1, wherein the electronic switching device is connected in series with the trimming resistor and the trimming resistor can be switched off by opening the electronic switching device.

24. The oscillator according to claim 1, wherein the electronic switching device is an analog switch.

25. The oscillator according to claim 1, wherein the electronic switching device is a CMOS-based analog switch.

26. The oscillator according to claim 1, wherein the control device is a microcontroller.

27. The inductive proximity switch according to claim 26, which, to generate a detection signal, which indicates that a target is approaching, evaluates:
    a damping of the oscillator by the target to be detected, and at least one of:
    a change in the inductance of the resonant circuit by the target; or
    a change of a coupling of the inductor of the resonant circuit to a further inductor, in particular a receiving coil.

28. The inductive proximity switch according to claim 26, wherein the control device is designed to adjust a switching distance by changing the switching sequence.

29. The inductive proximity switch according to claim 26, wherein the control device, for providing a switching hysteresis, is designed
    to increase the switching distance after switching of the proximity switch due to a target approaching the proximity switch, and
    to decrease the switching distance after switching of the proximity switch due to the target moving away from the proximity switch.

30. The inductive proximity switch according to claim 29, wherein the control device, for providing a switching hysteresis, is designed, after switching of the proximity switch due to a target approaching the proximity switch, to increase the temporal mean value of the electrical resistance of the trimming circuit and, after switching of the proximity switch due to the target moving away from the proximity switch, to reduce the temporal mean value of the electrical resistance of the trimming circuit; or
    the control device for providing a switching hysteresis is designed, after switching of the proximity switch due to a target approaching the proximity switch, to reduce the temporal mean value of the electrical resistance of the trimming circuit and, after switching of the proximity switch due to the target moving away from the proximity switch, to increase the temporal mean value of the electrical resistance of the trimming circuit.

31. The oscillator according to claim 1, wherein
the control device digitally controls the electronic switching device.

32. The oscillator according to claim 1, wherein
there is a temperature measuring device for measuring the temperature of at least the resonant circuit and, based on a temperature measured by the temperature measuring device, the switching sequence can be changed to compensate for temperature drifts.

33. An inductive proximity switch having an oscillator according to claim 1.

34. An oscillator, comprising:
a resonant circuit having at least one inductor and at least one capacitor and a feedback amplifier,
wherein in at least one feedback circuit of the amplifier there is at least one trimming resistor,
wherein
there is an electronic switching device for alternately switching on and switching off the trimming resistor,
a trimming circuit is formed by the trimming resistor and the electronic switching device,
there is a control device to control the electronic switching device,
the electronic switching device, together with the control device, is designed to alternately switch on and switch off the trimming resistor in a switching sequence, and
a temporal mean value of the electrical resistance of the trimming circuit is defined by the switching sequence, which is effective during oscillator operation, wherein
the temporal mean value of the electrical resistance of the trimming circuit is given by the value of the trimming resistor and by a ratio of a sum of the periods in which the trimming resistor is switched on to a sum of the periods in which the trimming resistor is switched off, and
the temporal mean value of the electrical resistance of the trimming circuit is given by the value of the trimming resistor and the duty cycle of a pulse width modulation.

35. An inductive proximity switch having an oscillator according to claim 34.

* * * * *